United States Patent
Kimoto

(10) Patent No.: US 7,443,182 B2
(45) Date of Patent: Oct. 28, 2008

(54) COORDINATE TRANSFORMATION DEVICE FOR ELECTRICAL SIGNAL CONNECTION

(76) Inventor: Gunsei Kimoto, 1-3-2-807, Daiba, Minato-ku, Tokyo (JP)

( * ) Notice: Subject to any disclaimer, the term of this patent is extended or adjusted under 35 U.S.C. 154(b) by 0 days.

(21) Appl. No.: 11/935,868

(22) Filed: Nov. 6, 2007

(65) Prior Publication Data

US 2008/0116920 A1    May 22, 2008

(30) Foreign Application Priority Data

Nov. 14, 2006  (JP)  ............... 2006-335100

(51) Int. Cl.
  *G01R 31/02*  (2006.01)
  *G01R 31/26*  (2006.01)
(52) U.S. Cl. .............. 324/754; 324/765; 324/758; 324/761; 324/158.1
(58) Field of Classification Search .......... 324/754–765
See application file for complete search history.

(56) References Cited

U.S. PATENT DOCUMENTS 3,611,128 A * 10/1971 Nagata ................ 324/72.5
6,271,674 B1 * 8/2001 Hasegawa et al. ............ 324/754
6,586,955 B2 * 7/2003 Fjelstad et al. .............. 324/754

FOREIGN PATENT DOCUMENTS

JP    2004274010    9/2004
JP    2005300545    10/2005

* cited by examiner

*Primary Examiner*—Ha Nguyen
*Assistant Examiner*—Emily Y Chan
(74) *Attorney, Agent, or Firm*—Haynes and Boone, LLP

(57) ABSTRACT

There is disclosed a coordinate transformation device for electrical signal connection used for a probe card applicable to narrow pitch pads, which particularly simplifies wiring from the terminal onto the inspection apparatus board and prevents electrical contact failure. In the coordinate transformation device for electrical signal connection, an input terminal of a first wiring group corresponding to one of probe output terminals is provided with at least two terminals independently movable in a yz plane. When the probe output terminal and the input terminal of the first wiring group are contacted and conducted with each other, a wall surface of a first terminal of the input terminal of the first wiring group comes into contact with a side wall of the probe output terminal, and a wall surface of a second terminal thereof comes into contact with a side surface on the opposite side of the probe output terminal.

6 Claims, 8 Drawing Sheets

COORDINATE TRANSFORMATION DEVICE FOR ELECTRICAL SIGNAL CONNECTION

CROSS REFERENCE TO RELATED APPLICATION

This application claims priority to Japanese patent application number 2006-335100, filed on Nov. 14, 2006, the disclosure of which is incorporated herein by reference.

BACKGROUND OF THE INVENTION

1. Field of the Invention

The present invention relates to a coordinate transformation device for electrical signal connection used for a probe card and the like, and more particularly to a coordinate transformation device for electrical signal connection to effectively provide wiring from contacts onto a probe card substrate.

2. Description of Prior Art

A probe card is used for circuit inspection of plural semiconductor chips formed on a wafer in the production process of an electronic device such as LSI. The probe card generally includes a mother board of a printed board that is provided with a common design independent of the type of semiconductor device; terminal pins that are arranged with a common design independent of the type of semiconductor device and are connected to a tester; probes arranged according to the type of the semiconductor device; and a child board of a printed board that is designed according to the type of semiconductor device to connect the probes with the terminal pins.

The child board has a function of transforming contact wiring of a narrow pitch into wiring of a rough pitch, and can be designed to be robust to measurement noise due to an appropriate shielding design. However, along with the increase of the integration of electronic devices, the number of circuit terminals (pads) on a semiconductor chip is increased and the pad pitch is narrowed. This leads to the necessity of further multi-layering of the child board and further reduction of the wiring, making the child board expensive to produce.

Meanwhile, the probe pin structure has requirements such as adaptation to the increasingly miniaturized pad arrangement and the narrowing of pitch, as well as precise control of behavior in the vicinity of the contact portion of the probe including the overdrive and scrub functions. In order to meet such requirements, the inventors have proposed improved technologies (for example, Patent Document 1: JP-A No. 274010/2004, and Patent Document 2: JP-A No. 300545/2005). These improved technologies propose a contact assembly formed by use of a resin film to which a copper foil as a metal foil is attached, etching the copper foil to form a conductive pattern of an electrical conductor including a probe function on the resin film, and laminating plural sheets of the resin film with the probe function. The contact assembly performs circuit inspection of semiconductor chips by bringing ends of the probes into contact with electrode pads of the semiconductor chips at a time.

The inventors have proposed a probe structure by film lamination. That is, as shown in FIG. 24 and other figures of Patent Document 1 and in FIG. 1 and other figures of Patent Document 2, a probe assembly is formed by attaching a copper foil plate to a surface of a ribbon-like (strip-like) resin film, forming a copper probe having a curved portion on the resin film surface by etching the copper foil plate, and laminating plural sheets of the resin film with the probe.

The inventors have also proposed a coordinate transformation device for electrical signal connection as a wiring method involved in the increased number of pads and the reduced pad pitch. The coordinate transformation device for electrical signal connection has a first wiring group and a second wiring group. The first wiring group is formed by use of a resin film to which a copper foil is attached, and etching the copper foil to form a conductive pattern on the resin film. The conductive pattern has input and output terminals protruding from the outer periphery of the resin film, in which the probe output terminal pitch is defined as the input terminal pitch, and the output terminal has a pitch larger than the input terminal pitch in a first horizontal direction (y direction). In the second wiring group, the output terminal pitch of the first wiring group is defined as the input terminal pitch, and the output terminal has a pitch larger than the input terminal pitch in a second horizontal direction (x direction) perpendicular to the first horizontal direction.

As an existing example, the above proposition will be described with reference to FIGS. 6A and 6B. FIG. 6A is a schematic assembly view of film-laminated type probes, which is an exploded perspective view showing a configuration of film-laminated type probes combined with a coordinate transformation device for electrical signal connection, including wiring to a mother board. FIG. 6B is a schematic front view showing a configuration of one film laminated type probe.

In FIG. 6B, a conductive portion 102 and enhanced conductive dummy portions 105 and so on are all formed by attaching a copper foil (e.g., beryllium copper) as a metal foil onto a resin film (e.g., polyimide resin) 101 and by etching the copper foil. Further, an insulating dummy portion 106 is formed by printing an insulating resin in a space between the conductive portion 102 and the enhanced conductive dummy portions 105 and so on. The resin film 101 has been provided with an opening 107 for inserting therethrough a support rod to fix plural resin films, which will be described below, and with a cut 108 for ensuring the probe movement. An end of the conductive portion 102, which is referred to as a probe end 103, comes into contact with a chip pad, and the other end thereof has a terminal 104 to be connected to a terminal of the coordinate transformation device for electrical signal connection described below.

FIG. 6A shows a general assembly view of the film laminated type probes having the function described above. More specifically, an LSI chip 109A has n pads 109p1-1 to 109p1-n on one side and n pads 109p2-1 to 109p2-n on the other side. In relation to the LSI chip 109A, a film-laminated type probe assembly 100A is formed by laminating film-laminated type probes 100a-1 to 100a-n and 100b-1 to 100b-n each corresponding to the pads arranged as described above, and by inserting support rods 110a, 110b into the laminated probes. Similarly, a film-laminated type probe assembly 100B is formed in relation to an LSI chip 109B, a film-laminated type probe assembly 100C is formed in relation to an LSI chip 109C, and a film-laminated type probe assembly 100D is formed in relation to an LSI chip 109D. The four film-laminated type probe assemblies are fixed together (not shown), and thus a probe assembly available for four chips is formed.

The figure also shows an example in which the probe assembly is connected to an inspection apparatus printed board 117 via a y-direction wiring group 111 and an x-direction wiring group 114. The y-direction wiring group 111 is formed by wiring conductors 113 on a resin film 112. The y-direction wiring group 111 has input portions 113 in that are arranged in line with a pitch Pa-in of plural signal line terminal portions 104 on one straight line selected in the film-laminated type probe assembly 100A. The input portions 113 in are formed so as to slightly protrude from the resin film 112. The pitch of the conductive patterns is extended in the y direction in a process to reach the output portions 113 out of the y-direction wiring group. Finally output terminals are formed to have a pitch Pa-out. The output portions 113 out of the y-direction wiring group are also formed so as to slightly protrude from the resin film 112.

Similarly, an x-direction wiring group 114 is formed by wiring conductors 116 on a resin film 115. The x-direction wiring group 114 has input portions 116 in that are arranged in line with a pitch Pb-in of the output portions 113 out of plural y-direction wiring groups on one straight line selected in the plural y-direction wiring groups 111. The input portions 116 in are formed so as to slightly protrude from the resin film 115. The pitch of the conductive patterns is extended in the x direction in a process to reach the output portions 116 out of the x-direction wiring group. Finally output terminals are formed to have a pitch Pb-out matching the pitch of the input terminals 118 in of the inspection apparatus printed board. The output portions 116 out of the x-direction wiring group are also formed so as to slightly protrude from the resin film 114.

The y-direction wiring groups 111 and x-direction wiring groups 114, which are formed as described above, are laminated and fixed, respectively. The film-laminated type probe assembly 100A and the y-direction wiring groups 111, the y-direction wiring groups 111 and the x-direction wiring groups 114, and the x-direction wiring groups 114 and the inspection apparatus printed board 117 are brought into contact at their input/output terminals which are formed so as to slightly protrude from the respective resin films, without being subjected to soldering. In this way, electrical continuity can be established. FIG. 7A shows a detailed view of the connection between the signal line terminal 104 of the probe and the input portion 113 in of the y-direction wiring group. FIG. 7B shows a detailed view of the connection between the output portion 113 out of the y-direction wiring group and the input portion 116 in of the x-direction wiring portion.

On the inspection printed board 117, each wiring is further guided from an input terminal 118 in of the inspection apparatus printed board to an output terminal 118 out thereof having a standard pitch Pc-out by a conductive pattern 118. The wiring is brought into contact with a pogo pin 119 of the inspection apparatus, and then an inspection is performed.

As described above, by combing the film-laminated type probe assembly and the wiring groups which are the coordinate transformation device, it is possible to gradually extend the high-density wirings in the vicinity of the high-density pads with narrow pitch, to the rough pitch of the input portions of the existing inspection apparatus board. Thus, it is possible to achieve a design suitable for the existing inspection apparatus board. In addition, the input terminal positions of the inspection apparatus board can be arbitrary designed, so that it is possible to realize a board having fewer layers than the existing multi-layer (several tens of layers) board. As a result, a low-cost probe device can be provided. Further, soldering is not necessary, so that the number of assembly man-hours is reduced and maintainability is improved.

However, in the conventional invention, after the film-laminated type probe assembly and the coordinate transformation device are laminated, the respective input/output terminals are connected by a spring force only in the z direction (pushing direction) held by each of the terminals, which has resulted in variation of the resistances of the terminals and occurrence of contact failure, or other problems.

The present invention is made to solve such problems, and is desirable to provide a low-cost probe device with high connection reliability capable of being applied to high density and arrow pitch pads, in which the electrical connection is ensured between the terminals of the film-laminated type probe assembly and the coordinate transformation device.

SUMMARY OF THE INVENTION

In order to achieve the above object, the present invention provides a coordinate transformation device for electrical signal connection having a first wiring group, in which an input terminal thereof corresponding to one output terminal of film-laminated type probes includes at least two terminals independently movable in the yz plane. When the probe output terminal and the input terminal of the first wiring group are contacted and conducted with each other, a wall surface of a first terminal of the input terminal of the first wiring group comes into contact with a side surface of the probe output terminal, and a wall surface of a second terminal thereof comes into contact with a side surface on the opposite side of the probe output terminal. With this configuration, the electrical connection between the output terminal of the probe and the input terminal of the first wiring group is ensured, thereby preventing the contact failure and reducing the variation of the contact resistances.

Further, the present invention is characterized in that the input terminal to be connected to a conductive pattern of the first wiring group is defined as the first terminal, and by use of a resin film to which a metal foil is attached, the second terminal is formed on the resin film by etching the metal foil, and the resin film is attached to both sides of a resin film forming the first wiring group. With this configuration, the electrical connection can be ensured between the probe output terminal and the input terminal of the first wiring group in a small space.

Further, the present invention is characterized in that a distance between the facing wall surfaces of the first terminal and the second terminal, which come into contact with the side surfaces of the probe output terminal, has been set smaller than the thickness of the conductive pattern forming the probe output terminal to be contacted. With this configuration, when the output terminal of the probe is inserted and comes into contact with the input terminal of the first wiring group, a spring force is applied in a direction between the two terminals of the input terminal of the first wiring group.

Thus, the mechanical connection between the output terminal of the probe and the input terminal of the wiring group is further strengthened, thereby preventing the contact failure and reducing the variation of the contact resistances.

BRIEF DESCRIPTION OF THE DRAWINGS

FIGS. 2A, 2B are plane views showing the components of a first wiring group of the coordinate transformation device for electrical signal connection according to the embodiment of the present invention, in which FIG. 2A is a view showing a main first wiring group, and FIG. 2B is a view showing a second terminal group of input terminals of the first wiring group;

FIGS. 6A, 6B are views showing a conventional example, in which FIG. 6A shows a probe assembly and a coordinate transformation device for electrical signal connection; and FIGS. 7A, 7B are perspective views in which FIG. 7A shows the connection relationship between the output terminal of the existing probe and the input terminal of the first wiring group of the existing coordinate transformation device for electrical signal connection, and FIG. 7B shows the connection relationship between the output terminal of the first wiring group and the input terminal of the second wiring group.

DETAILED DESCRIPTION OF THE PREFERRED EMBODIMENT

Hereinafter, a preferred embodiment of the present invention will be described with reference to the accompanying drawings. It is to be noted that the present invention is not limited to such an embodiment.

Figure 1:
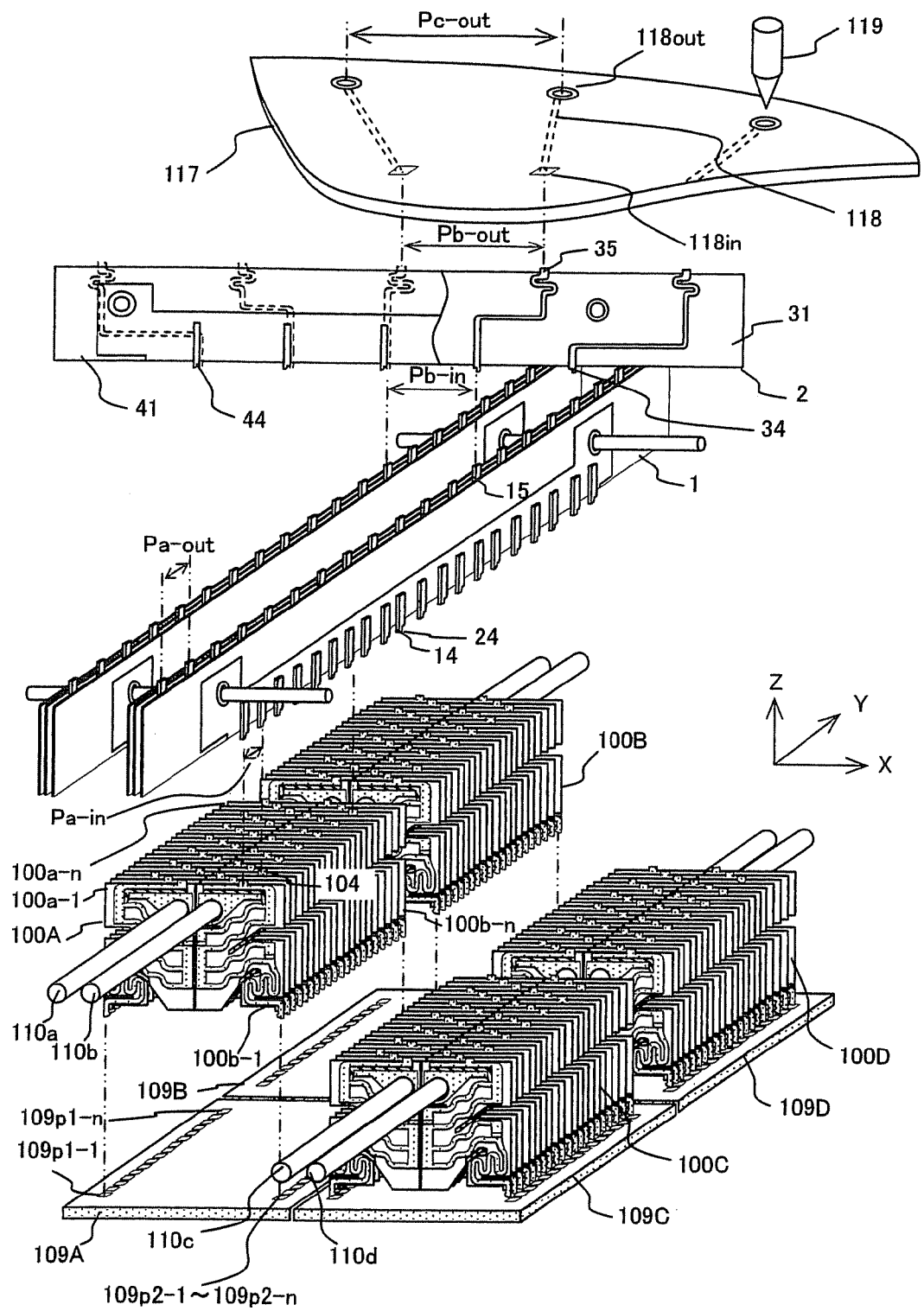
FIG. 1 is a general view showing a probe assembly and a coordination transformation device for electrical signal connection, according to an embodiment of the present invention.

FIG. 1 shows a general assembly view of a probe structure according to an embodiment of the present invention. In FIG. 1, the configuration of film-laminated type probes and the configuration of an existing inspection apparatus printed board, which are denoted by reference numerals 100 (A to D) to 119, are the same as those in the conventional example, and the description thereof will be omitted. A difference of the present embodiment from the conventional example is in the configuration of a first wiring group 1 and a second wiring group 2 in a coordinate transformation device for electrical signal connection.

Figure 2A:
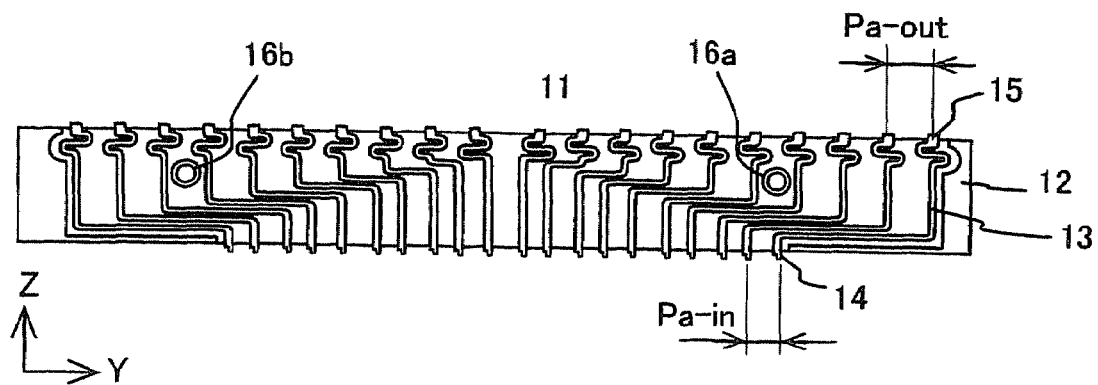
Figure 2B:
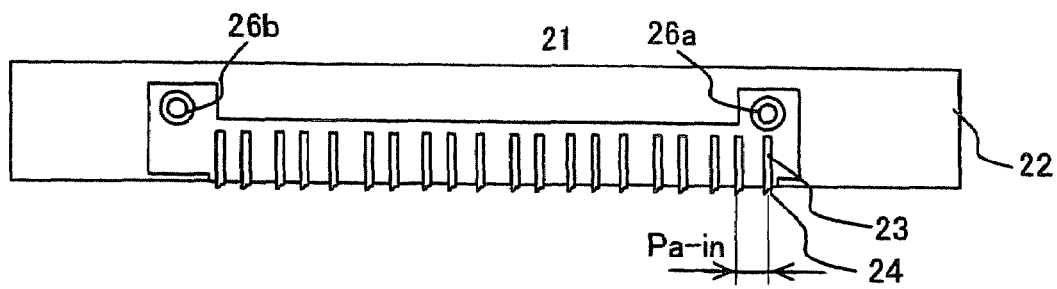

FIGS. 2A, 2B show a structure of a first (y-direction) wiring group in a coordinate transformation device for electrical signal connection according to the embodiment of the present invention. In FIG. 2A, reference numeral 11 denotes a main first wiring group having conductive portions. In the embodiment, a copper foil is used as a metal foil. In addition to copper, almost all the metals such as gold, silver, aluminum, and nickel, or their alloys could be used here. A resin film 12 to which the copper foil is attached is etched to form conductive patterns 13 on the resin film 12. The y-direction wiring group has input portions 14 that are arranged in line with a pitch Pa-in of plural signal line terminal portions on one straight line selected in signal line terminals 104 of a film-laminated type probe assembly 100A or other film-laminated type probe assemblies. The input portions 14 are formed so as to slightly protrude from the resin film 12. The pitch of the conductive patterns is extended in the y direction in a process to reach the output portions of the y-direction wiring group. Finally output terminals 15 are formed to have a pitch Pa-out which is larger than the input terminal pitch. The output portions 15 of the y-direction wiring group are also formed so as to slightly protrude from the resin film 12. Further, the main first wiring group 11 is provided with holes 16a, 16b for inserting therethrough support rods to fix plural first wiring groups, which will be described below.

FIG. 2B shows components forming a second terminal group 21 of the input terminals of the first wiring group according to the embodiment of the present invention. A resin film 22 to which a metal foil is attached is etched to form second terminals 23 on the resin film 22. The second terminals 23 are arranged in line with a pitch of the input portions 14 of the first wiring group. Similarly as described above, second terminal ends 24 are formed so as to slightly protrude from the resin film 22. Further, the second terminal group 21 is provided with holes 26a, 26b for inserting therethrough the support rods for fixing.

Figure 3A:
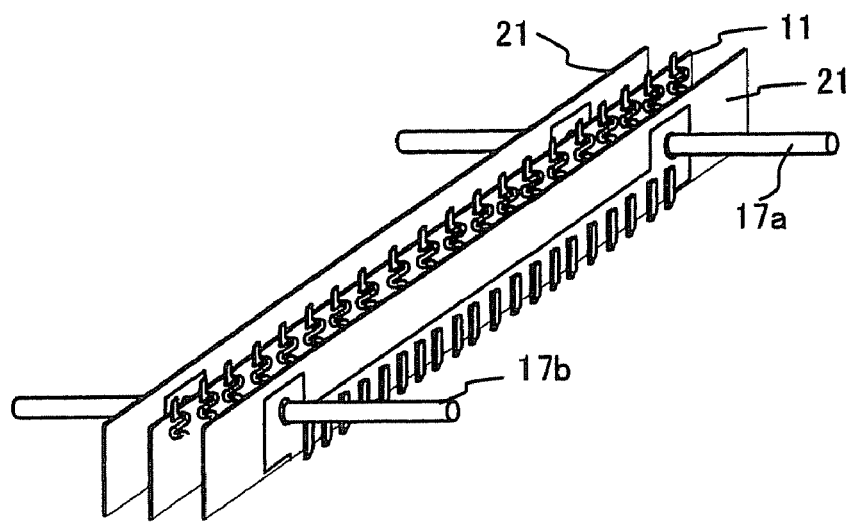
FIGS. 3A, 3B are perspective views showing an assembly method of the first wiring group of the coordinate transformation device for electrical signal connection, according to the embodiment of the present invention.
Figure 3B:
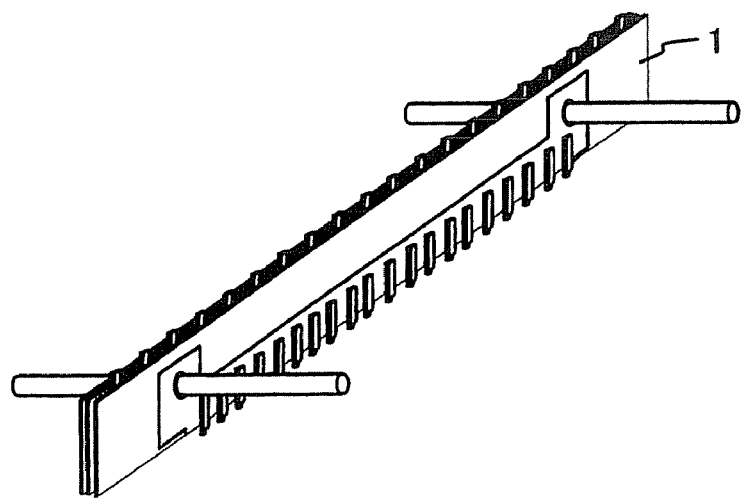

FIGS. 3A, 3B show partial assembly views of the first wiring group described above. In FIG. 3A, the second terminal group 21 is provided on both sides of the main first wiring group 11, and support rods 17a, 17b are inserted to attach and fix each of them. In this way, a first wiring assembly 1 shown in FIG. 3b is formed. Similarly, plural first wiring groups are fixed by the same support rods 17a, 17b inserted therethrough. In this way, the first wiring group 1 can be formed so as to correspond to the signal line terminal group of one film-laminated type probe assembly.

Figure 4:
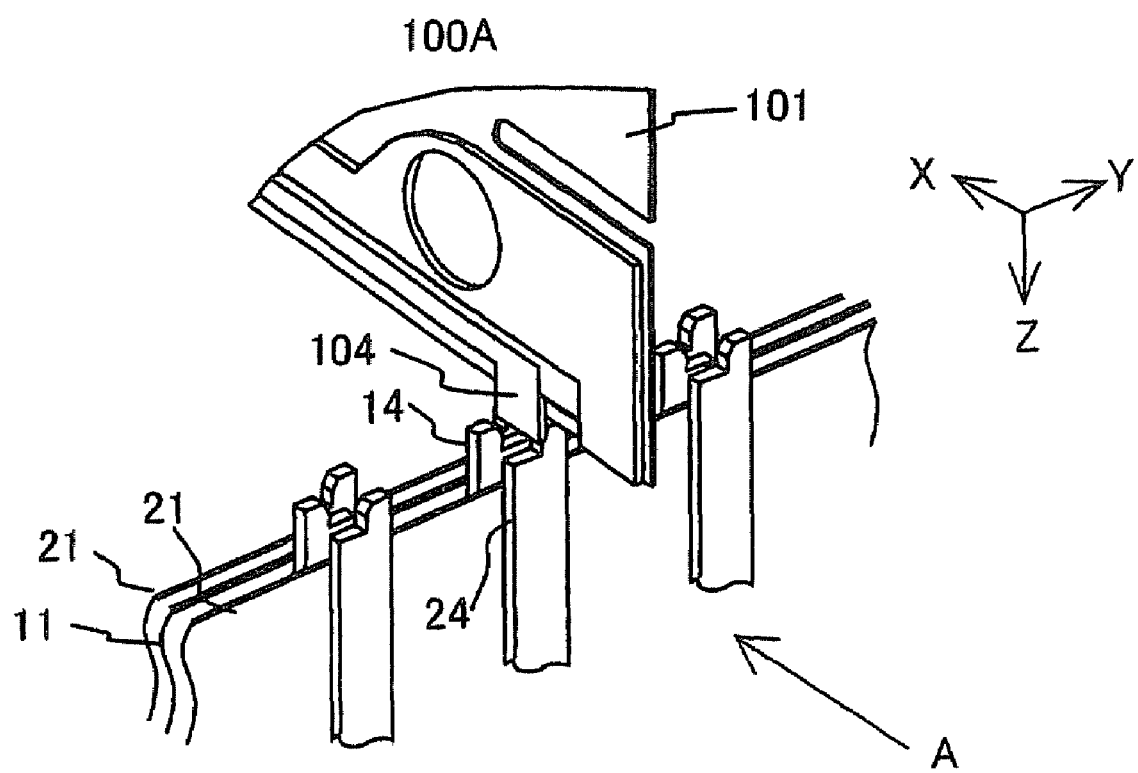
FIG. 4 is a perspective view showing the connection relationship between the output terminal of the probe and the input terminal of the first wiring group of the coordinate transformation device for electrical signal connection, according to the embodiment of the present invention.
Figure 5B:
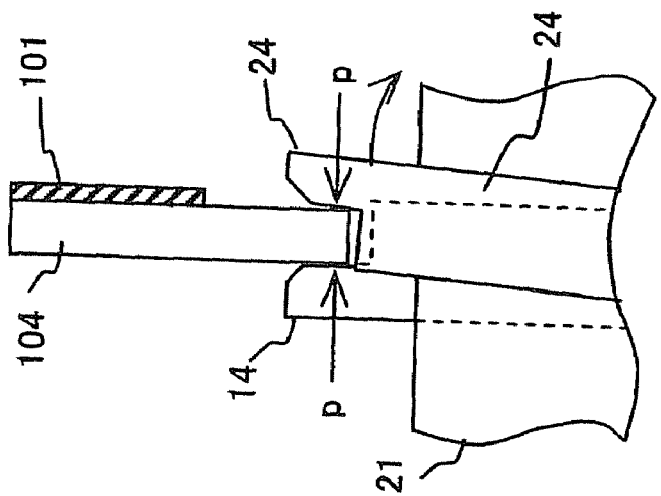
FIGS. 5A, 5B are views showing the movement of the connection between the output terminal of the probe and the input terminal of the first wiring group of the coordinate transformation device for electrical signal connection, according to the embodiment of the present invention.
Figure 5A:
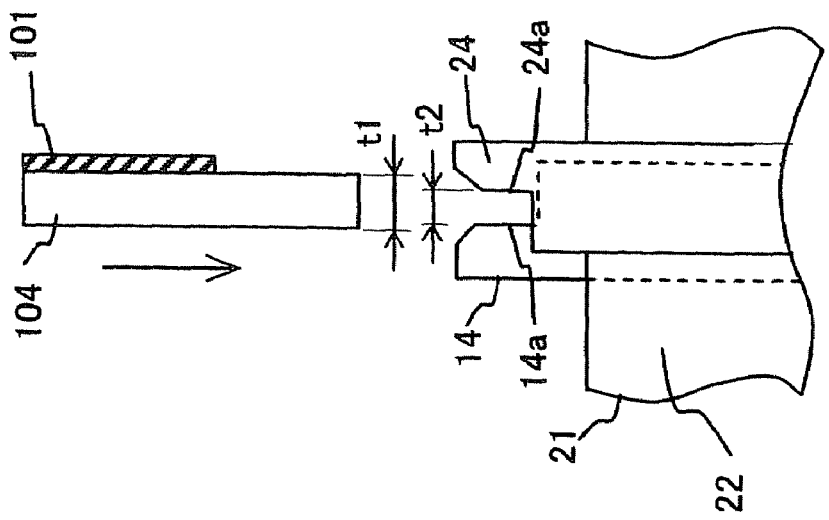
Figure 6A:
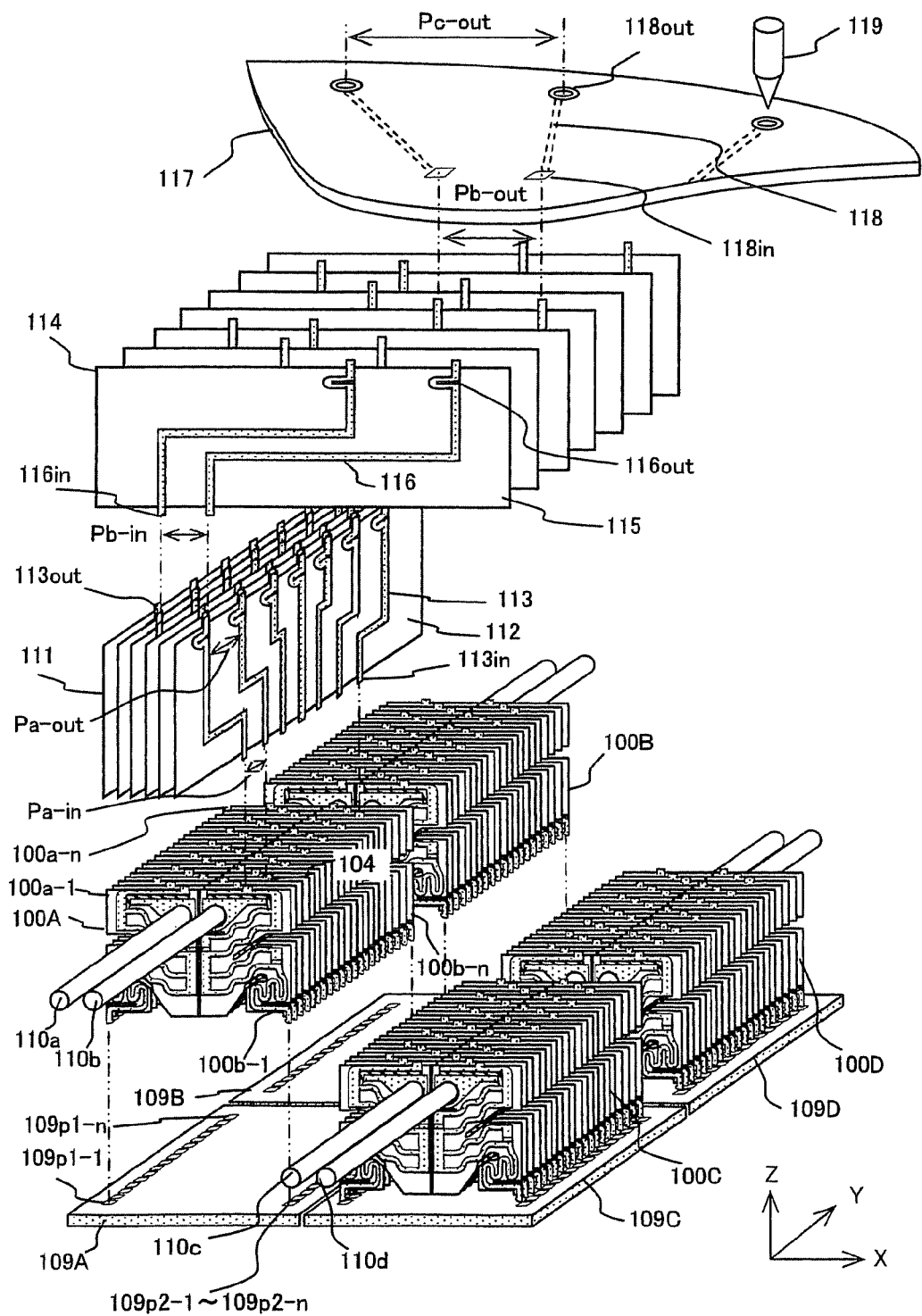
Figure 6B:
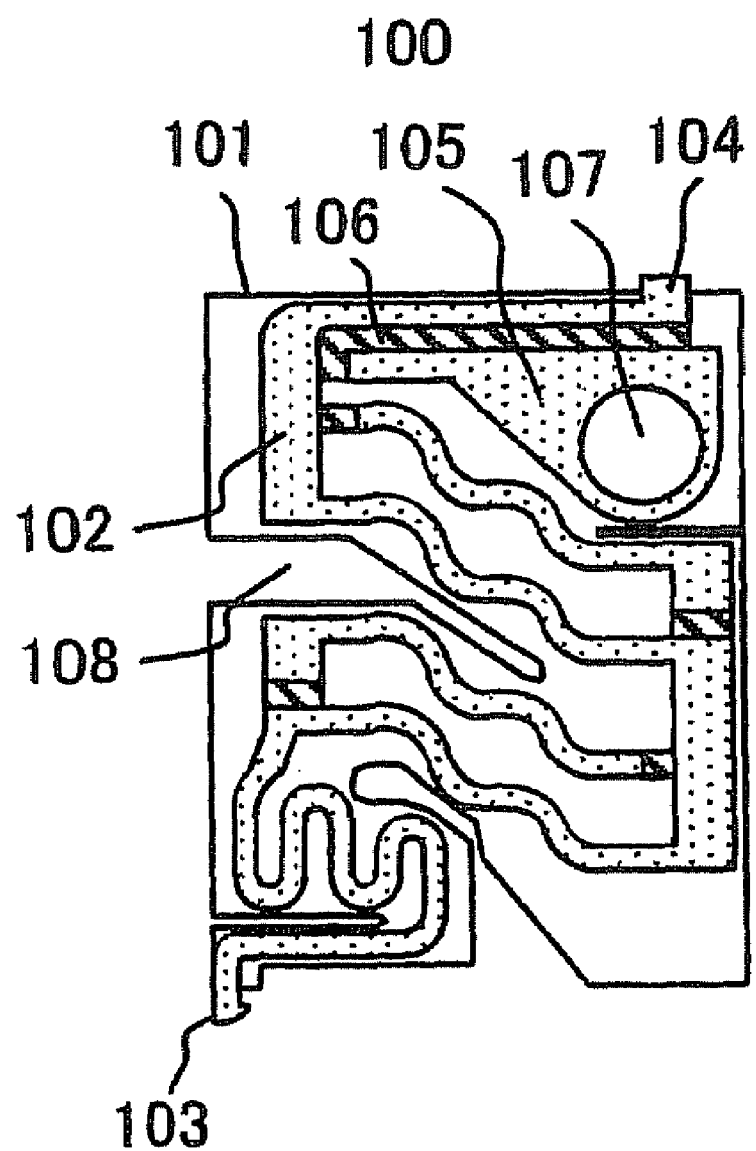
Figure 7A:
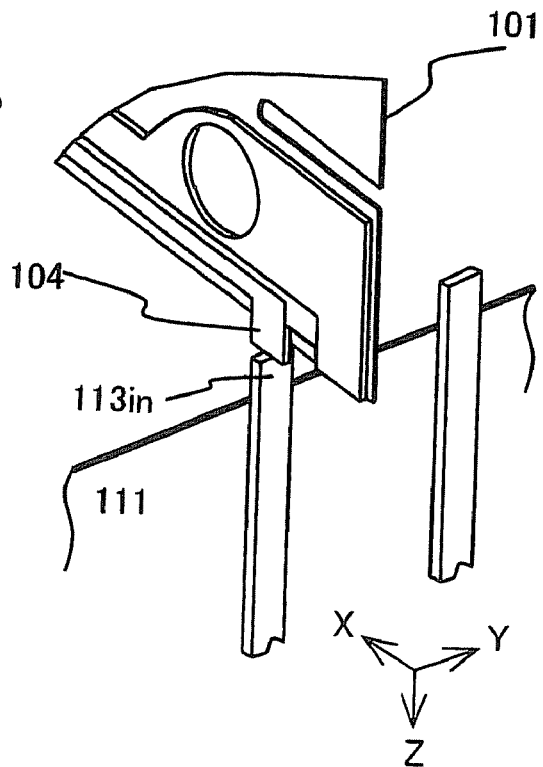
Figure 7B:
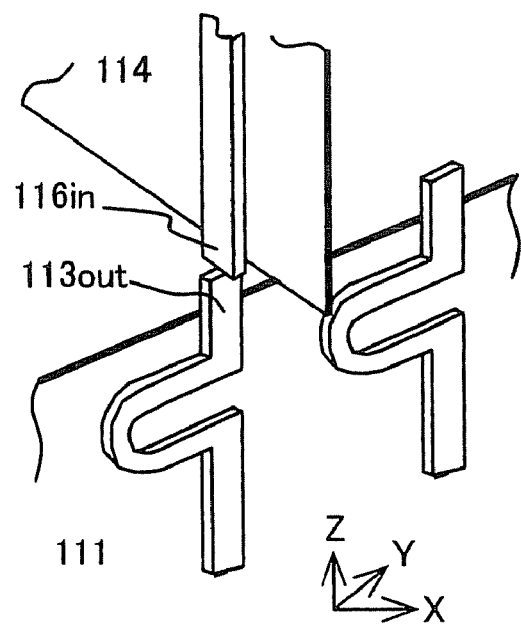

Referring to FIG. 4 and FIGS. 5A, 5B, a description will be given of the movement in the connection between the signal line terminal of the film-laminated type probe assembly 100A or other film-laminated type probe assemblies and the input terminal of the first wiring group, which have been described above. FIG. 4 is a perspective view of the positional relationship in the connection as viewed from the side of the film-laminated type probe assembly. In the connection, the output terminal 104 of the film-laminated type probe assembly 100A is connected and interposed between the input portion 14 of the first wiring group and the second terminal end 24.

FIGS. 5A, 5B are A-arrow views in FIG. 4, which illustrate in detail the movement in the connection. A wall surface 14a of the input portion 14 of the first wiring group and a wall surface 24a of the second terminal end 24 face each other at a distance t2. The distance t2 has been set smaller than a thickness t1 of the conductive pattern forming the output terminal 104 of the film-laminated type probe assembly 100A. The second terminal end 24 is formed of a metal foil on the resin film 22 with less rigidity, and can move independently of the input portion 14 of the first wiring group when the output terminal 104 of the probe is inserted between the input portion 14 of the first wiring group and the second terminal end 24. For this reason, a rotation is applied as shown in FIG. 5B to push the input portion 14 of the first wiring group and the second terminal end 24, and the space therebetween is enlarged. At this time, a reaction P due to the spring force of the second terminal end 24 to which the rotation is applied, is applied to both sides of the output terminal 104 of the probe, so that a stronger connection is maintained.

The above description is related to the connection between the output terminal 104 of the probe and the input portion 14 of the first wiring group. However, it is possible to maintain a strong connection with the same configuration as described above even in the connection between the output portion 15 of the first wiring group and an input portion 34 of the second wiring group. FIG. 1 is a partially broken view showing the second (x-direction) wiring group assembly 2 that is formed by attaching a resin film 41 having second terminal ends 44 to both sides of a main wiring group 31.

Because the coordinate transformation device for electrical signal connection has the feature as described above, the electrical connection between the output terminal of the probe and the input terminal of the first wiring group, as well as the mechanical connection between the first output terminal and the second input terminal are further strengthened. As a result, the electrical connection is enhanced, and thus the contact failure can be prevented and the variation of the contact resistances can be reduced.

As described above, with the coordinate transformation device for electrical signal connection according to the present invention, a low-cost probe device applicable to high density and narrow pitch pads is provided in the circuit inspection apparatus (prober) that is adapted to the narrowing of pitch of semiconductor devices. For example, the probe device has a function that can sufficiently follow the batch inspection of a wafer on which dozens to hundreds of semiconductor chips are formed with a diameter of 300 mm. In addition, it is possible to provide a child board having a structure of about two layers at low cost with high connection reliability.

The present invention has been described based on the preferred embodiment shown in the drawings. However, it will be apparent to those skilled in the art that various changes and modifications can easily be made without departing from the spirit of the present invention. The present invention includes such variations.

What is claimed is:

1. A coordinate transformation device for electrical signal connection, comprising:
    a contact assembly formed by use of a resin film to which a metal foil is attached to form a conductive pattern of an electrical conductor including a probe function on the resin film by etching the metal foil, and laminating a plurality of sheets of the resin film with the probe function, thereby to perform circuit inspection of semiconductor chips by bringing ends of the probes into contact with electrode pads of the semiconductor chips at a time;
    a first wiring group formed by use of a resin film to which a metal foil is attached to form a conductive pattern on the resin film by etching the metal foil, and providing the conductive pattern with input and output terminals protruding from the outer periphery of the resin film, in which an output terminal pitch of the probe is defined as an input terminal pitch and the output terminal has a pitch larger than the input terminal pitch in a first horizontal direction (y direction); and
    a second wiring group in which the output terminal pitch of the first wiring group is defined as the input terminal pitch and the output terminal has a pitch larger than the input terminal pitch in a second horizontal direction (x direction) perpendicular to the first horizontal direction,
    wherein the input terminal of the first wiring group corresponding to one of the probe output terminals includes at least two terminals independently movable in a yz plane, and
    when the probe output terminal and the input terminal of the first wiring group are contacted and conducted with each other, a wall surface of a first terminal of the input terminal of the first wiring group comes into contact with a side surface of the probe output terminal, and a wall surface of a second terminal comes into contact with a side surface on the opposite side of the probe output terminal.

2. The coordinate transformation device for electrical signal connection according to claim 1,
    wherein the input terminal to be connected to the conductive pattern of the first wiring group is defined as the first terminal,
    using the resin film to which the metal foil is attached, the second terminal is formed on the resin film by etching the metal foil, and
    the resin film is attached to both sides of the resin film forming the first wiring group.

3. The coordinate transformation device for electrical signal connection according to claim 2,
    wherein a distance between the facing wall surfaces of the first terminal and the second terminal, which come into contact with the side surfaces of the probe output terminal, has been set smaller than the thickness of the conductive pattern forming the probe output terminal to be contacted.

4. The coordinate transformation device for electrical signal connection according to claim 1,
    wherein the input terminal of the second wiring group corresponding to one output terminal of the first wiring group, includes at least two terminals independently movable in an xz plane, and
    when the output terminal of the first wiring group and the input terminal of the second wiring group are contacted and conducted with each other, a wall surface of the first terminal of the input terminal of the second wiring group comes into contact with a side surface of the output terminal of the first wiring group, and a wall surface of the second terminal of the input terminal of the second wiring group comes into contact with a side surface on the opposite side of the output terminal of the first wiring group.

5. The coordinate transformation device for electrical signal connection according to claim 4,
    wherein the input terminal to be connected to the conductive pattern of the second wiring group is defined as the first terminal,
    using the resin film to which the metal foil is attached, the second terminal is formed on the resin film by etching the metal foil, and
    the resin film is attached to both sides of a resin film forming the second wiring group.

6. The coordinate transformation device for electrical signal connection according to claim 4,
    wherein a distance between the facing wall surfaces of the first terminal and the second terminal, which come into contact with the side surfaces of the output terminal of the first wiring group, has been set smaller than the thickness of the conductive pattern forming the output terminal of the first wiring group to be contacted.

* * * * *